United States Patent [19]

Grudkowski

[11] Patent Number: 4,860,017
[45] Date of Patent: Aug. 22, 1989

[54] SAW CIRCUIT FOR GENERATING CONTINUOUS TIME-COHERENT RF CARRIERS

[75] Inventor: Thomas W. Grudkowski, Glastonbury, Conn.

[73] Assignee: The United States of America as represented by the Secretary of the Army, Washington, D.C.

[21] Appl. No.: 215,138

[22] Filed: Jul. 5, 1988

[51] Int. Cl.$^4$ .............................................. H01L 41/08
[52] U.S. Cl. .................................................. 342/201
[58] Field of Search ................. 342/201; 333/151, 154

[56] References Cited

U.S. PATENT DOCUMENTS

| 4,053,889 | 10/1977 | Johnson | 342/201 |
|---|---|---|---|
| 4,543,547 | 9/1985 | Picquendar et al. | 333/154 X |
| 4,675,839 | 6/1987 | Kerr | 333/154 X |
| 4,801,836 | 1/1989 | Mariani | 333/154 X |

OTHER PUBLICATIONS

"Correlation of Long Sequences Using a Saw Convolver and Recirculation Loop", by D. P. Morgan and J. M. Harrah, Proc. of 1975 IEEE Ultrasonics Symposium pp. 189–192.

"Introduction to Radar Systems", Second Edition, by Merrill I. Skolnik, pp. 420–434.

Primary Examiner—Thomas H. Tarcza
Assistant Examiner—Mark Hellner
Attorney, Agent, or Firm—Michael J. Zelenka; Ann M. Knab

[57] ABSTRACT

The surface acoustic wave device which generates two coherent signals from a single input. The inventive device has three interdigital transducers (IDT) spaced upon a single piezoelectric substrate. The central IDT has three sets of interdigital fingers.

A power splitter and an amplifier are connected between the central IDT and one of the other IDT's to form a recirculation loop. An input signal burst applied to the central IDT produces two coherent outputs at the remaining IDT and the power splitter.

3 Claims, 3 Drawing Sheets

SAW CIRCUIT FOR GENERATING CONTINUOUS TIME-COHERENT RF CARRIERS

The Government has rights in this invention pursuant to the terms of Contract DAAK20-81-C-0405 awarded by the Department of the Army.

TECHNICAL FIELD

This invention relates generally to piezoelectric devices and more particularly to surface acoustic wave devices with recirculation loops.

BACKGROUND OF THE INVENTION

Those concerned with the development of radar systems have engaged in a continuing search for systems with both long detection range and fine range resolution. Ideally, both goals may be accomplished by the transmission of extremely narrow pulses of exceptionally high peak power. However, there are practical limits on the level of peak power which can be generated, especially in a portable radar set-up. To obtain long detection ranges at pulse repetition frequencies (PRF) low enough for pulse delay ranging, fairly wide pulses must be transmitted.

So-called pulse compression techniques present one solution to the problem. Internally modulated pulses of sufficient width to provide the necessary average power are transmitted at a reasonable level of peak power are transmitted. When the echoes are received they are "compressed" by decoding or stripping their modulation.

A variety of pulse compression techniques is described in: Skolnik, "Introduction to Radar Systems" McGraw Hill, 1980, pp. 420-434. The two most common methods of coding are linear frequency modulation (chirping) and binary phase or polyphase modulation. In chirp modulation, the radio frequency of each transmitted pulse is increased at a constant rate throughout its length. Every echo, consequently, has the same linear increase in frequency. In phase modulation, each transmitted pulse is, effectivley, marked off into narrow segments of equal length. The phase of certain segments is shifted by 180° according to a predetermined binary code. In polyphase coding, a variety of different harmonically related phases, e.g. 0°, 180°, 270°, etc., is used.

A variety of methods have been developed for decoding the received echo and assigning the target to a specific range bin. One device used for decoding purposes is the time-integrating correlator. Operation of time integrating correlators is discussed in: B. J. Darby, et al. "The Tapped Delay Line Active Correlator: A Neglected SAW Device," 1975, IEEE Ultrasonics Symposium, IEEE Cat. No. 75CHO994-4SU, pp. 193 ∝ 196, September 1975.

Briefly, a SAW time-integrating correlator is composed of a multi-tapped SAW delay line, a balanced mixer array, and an integrator array. The outgoing signal carrier is modulated, as mentioned before, by the desired code at the time of transmission. A reference carrier (which is inputted to the mixer array) is modulated by the same (but delayed) code when the echo signal has returned. The echo signal is then interrogated after passage through the SAW delay line by the mixer array. The reference code modulation is applied at the time of range interrogation $\tau_R$. The reference carrier is not initialized at the time of signal transmission, $\tau_S$, but at the delay time of interrogation of a particular signal return, $\tau_R$. Consequently, the reference signal and the transmitted signal carriers are not phase-coherent for arbitrary delays.

The lack of coherence between the reference signal and the received echo results in an arbitrary phase factor of $2\pi f(\tau_R - \tau_S)$ where f is the carrier frequency. This results in a sinusoidal amplitude variation in the response of the time integrating correlator of the form cos $(2\pi(\tau_R - \tau_S))$ which produces false negatives, i.e. a target will not be detected except when the sinusoidal response is at its maximum. Clearly, this amplitude variation must be eliminated in order to detect returns at arbitrary differential time delays, $\tau_R - \tau_S$.

Those concerned with the development of radars using time integrating correlators are concerned with the problems of false negative responses and have continually sought for methods in apparatus which will improve the probability of detection of real targets through elimination of the problem of non-coherence between reference and transmitted signals.

SUMMARY OF THE INVENTION

Accordingly, it is an object of the present invention to provide a surface acoustic wave device which simultaneously generates two phase-coherent signals.

A further object of the present invention is to provide a circuit for generating continuous time coherent RF carriers for application to long code time-integrating correlators.

Still another object of the present invention is to provide a signal detection apparatus with improved detection probability.

Briefly, these and other objects are accomplished with a surface acoustic wave device having three sets of interdigital transducers (IDT's)—one set of IDT's at each end and one set in the center. The center set of IDT has two input taps. An amplifier and power splitter are connected between the center IDT and the IDT at one end. The amplifier is adjusted to yield nearly unity loop gain. The combination of two IDT's, amplifier and power splitter provides a recirculating loop capable of generating a continuous signal carrier. The IDT at the other end of the substrate receives energy from the recirculating loop via the piezoelectric substrate and provides a continuous coherent reference carrier. When the device receives a burst input directed into the central interdigital transducers, it produces two continuous synchronous carriers—one for signal, the other for the reference. The coherent reference carrier is thus available for in-phase interrogation of the received echoes.

BRIEF DESCRIPTION OF THE DRAWINGS

Further objects and advantages of the present invention will become apparent to those familiar with the art upon examination of the following detailed description and accompanying drawings in which.

DETAILED DESCRIPTION OF THE DRAWINGS

Figure 1:
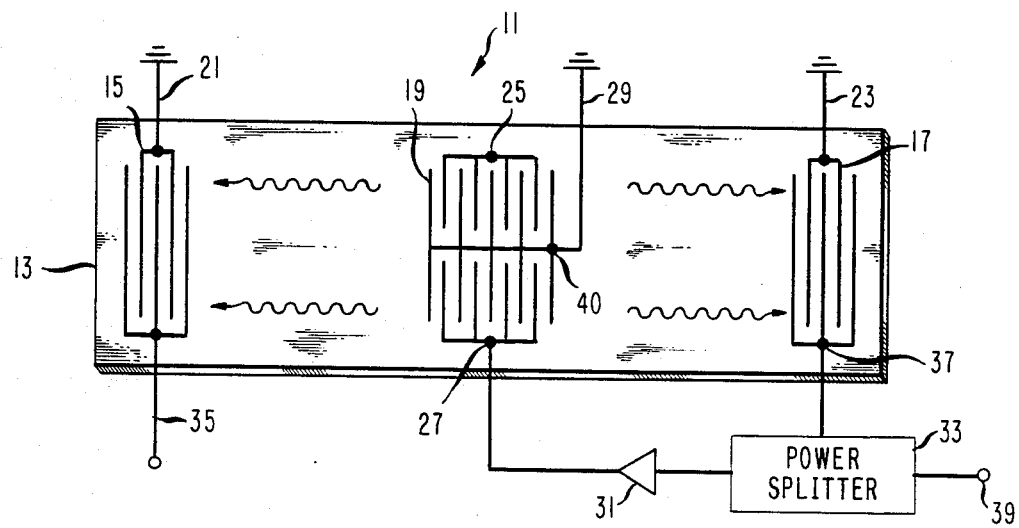
FIG. 1 is a partially perspective, partially schematic view of the inventive device.

Referring to FIG. 1, the inventive device is shown generally by reference numeral 11. Reference numeral 13 designates a piezoelectric substrate. Substrate 13 may be quartz, lithium niobate, gallium arsenide or another piezoelectric material.

Figure 1A:
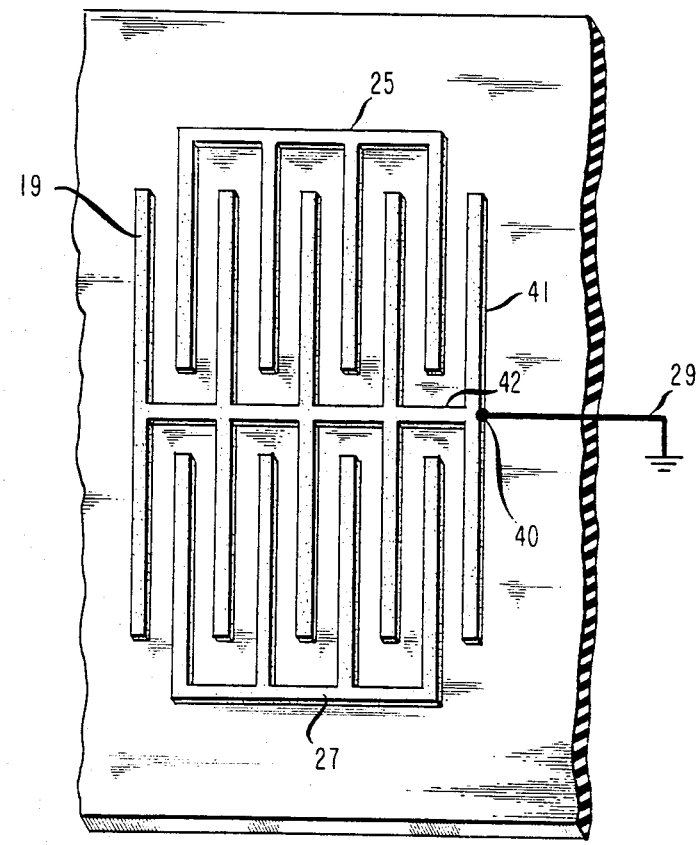
FIG. 1A is a perspective view of the central interdigital transducer of the inventive device.

Three sets of interdigital transducers (IDTs) are deposited upon the upper surface of substrate 13. IDTs 15 and 17 are of conventional design. Methods for fabricating IDTs, including choice of materials, deposition techniques, and the number of fingers required are well-known by those skilled in the art. Ground connections 21 and 23 are made to one side of IDTs 15 and 17 respectively. A third IDT 19 is located in the center of substrate 13. The details of construction of IDT 19 can be best understood by reference to FIG. 1A. In FIG. 1A, it can be seen that IDT 19 is essentially two side-by-side IDT's; the resulting configuration having four sets of interdigitated fingers denoted by reference numerals 25, 27, 40 and 41. Finger-sets 40 and 41 are connected by a common conductive strip 42. (The actual inventive device may have more or fewer fingers than those shown by IDTs 15, 17, or 10—the illustrations are shown with a small number of fingers for clarity). Thus, the IDT 19 can accommodate two inputs with finger-sets 40 and 41 being connected to common ground via lead 29.

Returning to FIG. 1, amplifier 31 and power splitter 33 are connected between finger-set 27 of IDT 19 and finger-set 37 of IDT 17. IDTs 19 and 17, together with amplifier 31 and power splitter 33 provide a recirculating loop whose operation will be described in further detail below.

In operation, a signal burst is input to finger-set 25 of IDT 19. A surface acoustic wave burst generates both left and right propagating surface acoustic waves on substrate 13. The wave propagation to the right is detected by transducer 17 after a delay equal to $\Delta T$ where $\Delta T$ is an integer times the time period $(1/f)$ of the carrier. The detected burst is split into two paths by power splitter 33. One path proceeds to output port 39 and constitutes the signal carrier upon which a suitable code may be impressed as mentioned before. The other path proceeds to the left from power splitter 33 to amplifier 31 whence it enters finger-set 27 of IDT 19 and the entire process is repeated. Amplifier 31 should be adjusted to have a gain which makes the loop gain nearly unity. In proper operation, the amplified output from amplifier 31 generates another burst via transducer 19. The burst propagates to the right and to the left. The burst which propagates to the right is again received by transducer 17 at a time exactly coincident with the end of the initially received burst, thus providing a continuous carrier frequency. The burst which propagates to the left is received by transducer 15 after a delay $\Delta T$. The reference carrier, obtained at finger 35 of IDT 15 is thus generated by repetitive bursts in the same manner as the signal carrier. It is noted that if the delay, $\Delta T$, is not exactly equal to an integer time the time period of the carrier $(1/f)$, the generated waveforms will suffer discontinuities at the burst intervals and will not be exactly continuous. This situation, while not optimal, will have a minimal effect on the performance of the correlator since identical discontinuities in the signal and reference signals will be produced for all time delays. Upon multiplication of the signal and reference within the time integrating correlator, such phase discontinuities will be removed.

Figure 2:
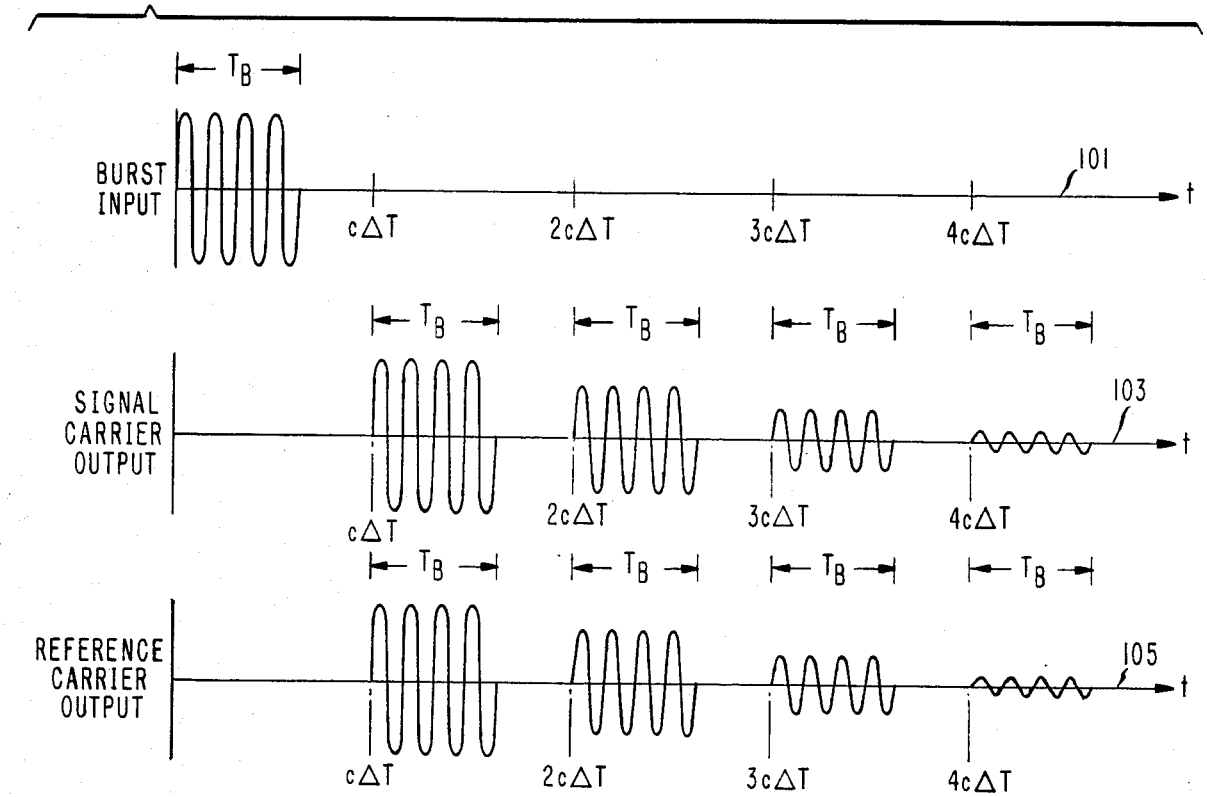
FIG. 2 is a series of three graphs illustrating the input to and output from the inventive device under less than optimal operating conditions.
Figure 3:
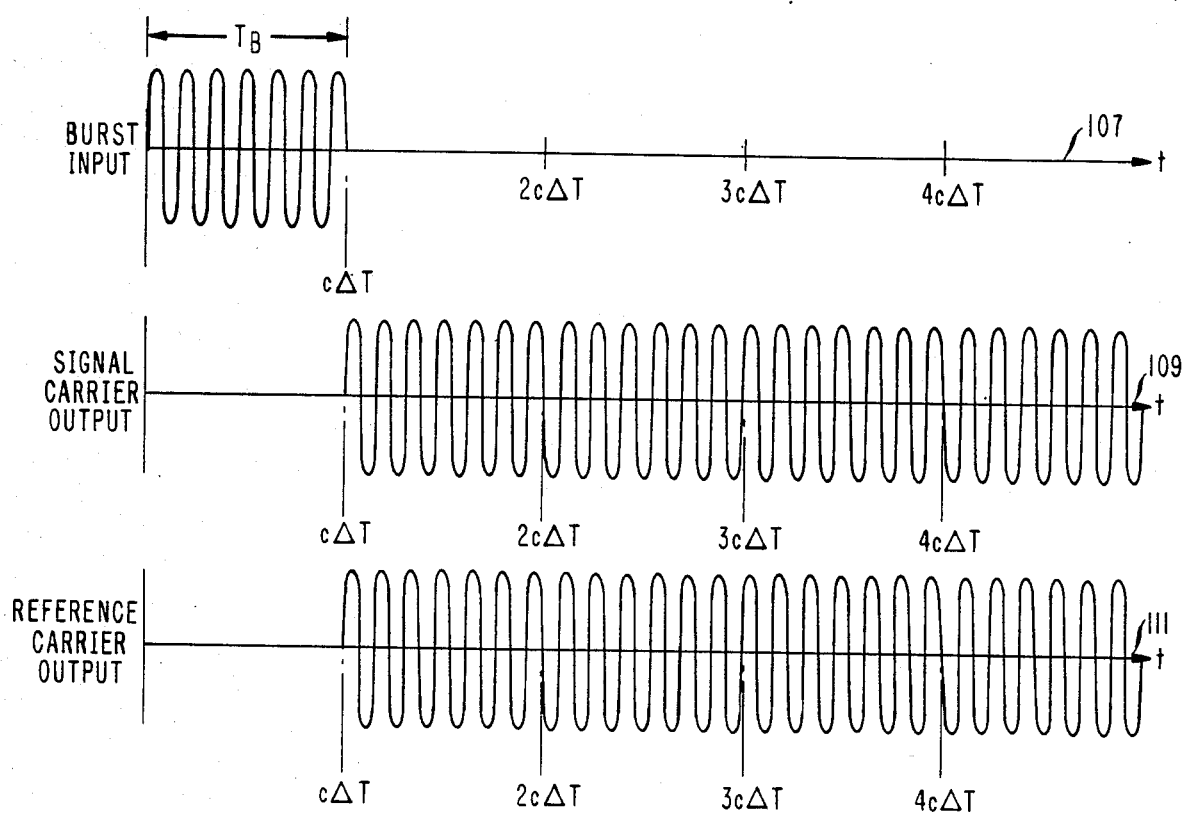
FIG. 3 is a series of three graphs illustrating the input to and outputs from the inventive device of FIG. 1 under optimal operating conditions.

FIGS. 2 and 3 provide graphs which are helpful in understanding the proper operation of the device shown in FIG. 1. the graphs of FIG. 2 illustrate operation of the device of FIG. 1 when proper operating conditions are not met. In graph 101 of FIG. 2 there is illustrated a burst input which might be fed to finger 25 of IDT 19. However, the duration, $T_B$, of the burst input is not equal to the SAW delay length, $c\Delta T$. Furthermore, it may be assumed that amplifier 31 has been adjusted so that the loop gain is less than unity. Graphs 103 and 105 show the expected output from terminals 39 and 35 of device 11. Both outputs consist of a series of diminishing bursts with duration equal to the initial burst input shown in graph 101. The signals illustrated in graphs 101, 103 and 105 are not representative of proper operation of device 11.

Turning now to FIG. 3, there is shown three graphs which are representative of proper operation of device 11. Graph 107 illustrates a burst input to finger 25 of IDT 19. Graph 107 may be contrasted with graph 101 of FIG. 2. In graph 107, the duration of the burst $T_B$, is equal to the SAW delay length $c\Delta T$. Furthermore, it is assumed that the gain of amplifier 31 has been adjusted so that the loop gain is nearly unity. Graphs 109 and 111 are representative, therefore, of the signals obtained from ports 39 and 35 respectively. It should be noted in the case of FIG. 3, that with a burst input of proper duration and proper adjustment of amplifier 31's gain, the resulting signal and reference carriers have continuous duration and uniform amplitude.

To maintain a loop gain equal to unity over many recirculations of the input burst, automatic gain control of the amplifier is required. It should be noted that the recirculating loop does not serve as an oscillator circuit, although the configuration would lend itself to oscillator operation if the loop gain were in excess of unity. However, operation as an oscillator circuit is not desired and would not improve the desired equality in delays of the carriers at the time of signal range interrogation at the correlator.

Figure 4:
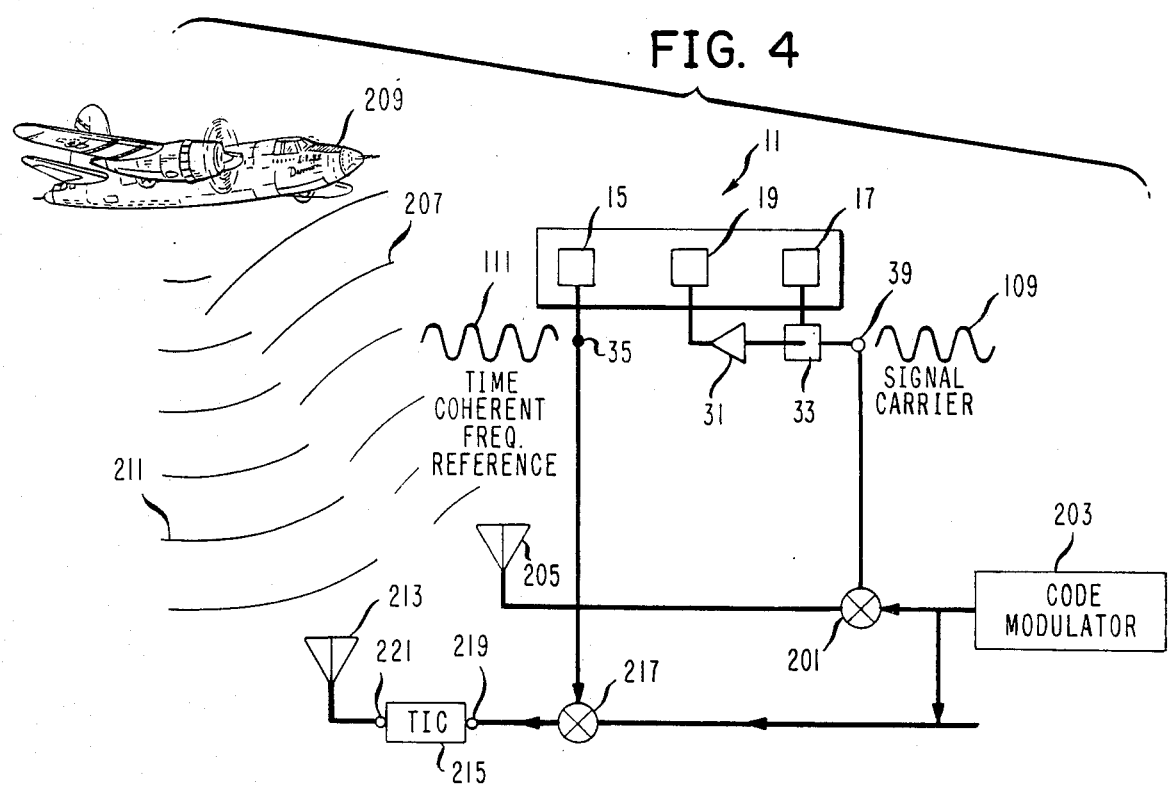
FIG. 4 is a schematic diagram illustrating operation of the inventive device in a radar system.
Figure 5:
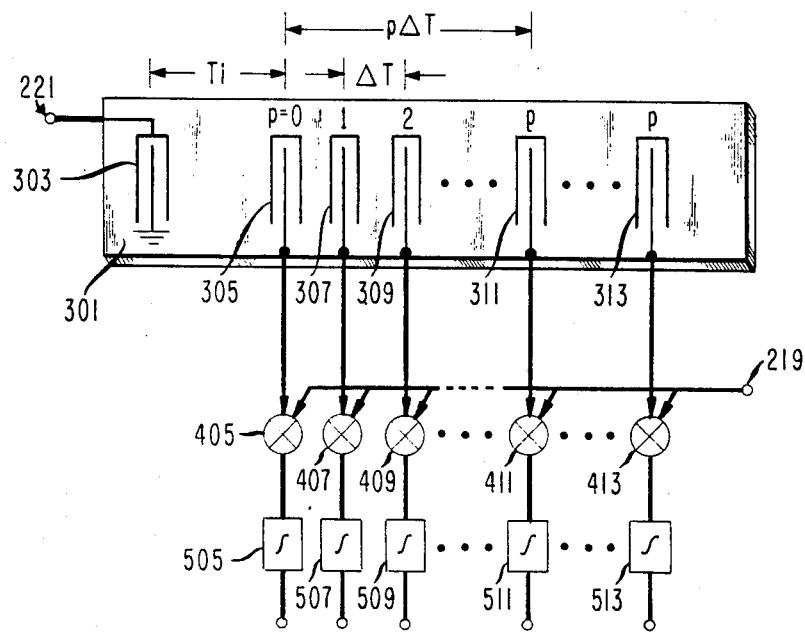
FIG. 5 is a schematic diagram illustrating the design of a time-integrating correlator (TIC) adapted for use with the present invention.

Some appreciation for the application of the inventive device may be gathered from examination of FIGS. 4 and 5 which schematically illustrates operation of radar system utilizing the inventive device.

In FIG. 4 the signal carrier 109 is fed to mixer 201. Input from code modulator 203 is also fed to mixer 201. The combined signal is pulsed and transmitted via antenna 205. The coded signal 207 strikes target 209. Reflected signal 211 is received by antenna 213 (which may be the same as antenna 205). Output from antenna 213 is ultimately fed to the time integrating correlator 215. Meanwhile, the phase coherent frequency reference signal 111 is available for coding via code modulator 203 and mixer 217.

Thus, both the coded received echo and coded time coherent frequency reference are inputted to the time integrating correlator 215 via input port 221 and 219 respectively.

Operation of the time integrating correlator 215 shown in FIG. 5 will now be described. The time integrating correlator 215 has a multi-tapped SAW delay line 305 and a piezoelectric substrate 301. A balanced mixer array 405–413 and an integrator array 505–513 are both connected to the SAW delay line taps.

A coded echo signal wave form propagates along the tapped delay line having an inter-tap time delay equal to ΔT. Delayed replicas of the coded echo wave form are detected at each of the taps 305, 307, 309, 311, and 313 and inputted to mixer array 405–413. At a particular synchronized tap, for example, tap 311, the signal and reference wave form codes match so that mixer 411, produces a constant dc output voltage, i.e. the code modulation is stripped from the carrier. At other taps, for example, 305, 307, 309, etc. the codes do not match and the mixer outputs 405, 407, 409, etc. produce a time varying voltage. At the synchronized tap 311, integrator 511, which receives the output from mixer 411, produces a linearly increasing voltage signal equal to the correlation peak after a time equal to the code length. At other taps, the integrators 505, 507, 509, etc. produce reduced voltages corresponding to sidelobes of the correlation response.

An advantage of using the time integrating correlator 215 is that signal durations on the order of milliseconds (as determined by the time constants of integrators 505–513) can be correlated using a delay line with microsecond delay. The use of multiple taps 305–313 provides a "range window" over which the desired synchronous condition between the coded echo wave form and reference wave forms can be achieved at one of the taps. Thus, the range to the target can be accurately determined.

Mathematical analysis shows that (i.e. the reference and signal carrier are not coherent) there is a probability that the output of integrator 511 will be artificially low or even zero. The present invention, by providing phase coherent reference and signal carrier minimizes this probability.

The illustrative embodiments herein are merely a few of those possible variations which will occur to those skilled in the art while using the inventive principles contained herein. Accordingly, numerous variations of invention are possible while staying within the spirit and scope of the invention as defined in the following claims and their legal equivalents.

What is claimed is:

1. A device comprising:
   a piezoelectric substrate;
   first, second and third interdigital transducers, said first and third interdigital transducers each having two sets of parallel interdigitated fingers, said second transducer having four sets of parallel interdigitated fingers, two of said sets of fingers of said second transducer being connected to a common conductive strip;
   a power splitter connected to said third interdigital transducer; and
   an amplifier connected between said power splitter and said second interdigital transducer whereby an input signal applied to said second interdigital transducer produces first input signal at said first interdigital transducer and a second output signal at said power splitter.

2. The device of claim 1 further including automatic gain control circuitry connected to said amplifier, said circuitry being capable of maintaining nearly unity loop gain.

3. The device of claim 1 further including:
   a mixer connected to said first interdigital transducer;
   a time integrating correlator being connected to the output of said mixer.

* * * * *